US012431396B2

(12) United States Patent
Watanabe et al.

(10) Patent No.: US 12,431,396 B2
(45) Date of Patent: Sep. 30, 2025

(54) TEMPERATURE CORRECTION INFORMATION CALCULATION DEVICE, SEMICONDUCTOR MANUFACTURING APPARATUS, STORAGE MEDIUM, AND TEMPERATURE CORRECTION INFORMATION CALCULATION METHOD

(71) Applicant: Tokyo Electron Limited, Tokyo (JP)

(72) Inventors: Tatsuya Watanabe, Yamanashi (JP); Yuichi Takenaga, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 719 days.

(21) Appl. No.: 17/828,487

(22) Filed: May 31, 2022

(65) Prior Publication Data
US 2022/0392814 A1 Dec. 8, 2022

(30) Foreign Application Priority Data
Jun. 8, 2021 (JP) .................................. 2021-096159

(51) Int. Cl.
*H01L 21/66* (2006.01)
*H01L 21/67* (2006.01)

(52) U.S. Cl.
CPC ........ *H01L 22/26* (2013.01); *H01L 21/67098* (2013.01); *H01L 21/67253* (2013.01); *H01L 22/12* (2013.01)

(58) Field of Classification Search
CPC ...................................................... H01L 22/26
See application file for complete search history.

(56) References Cited

U.S. PATENT DOCUMENTS 5,001,327 A * 3/1991 Hirasawa .......... H01L 21/67109
219/390
5,273,424 A * 12/1993 Kobayashi .............. C30B 33/00
432/24
5,616,264 A * 4/1997 Nishi ...................... C23C 16/46
219/486

(Continued)

FOREIGN PATENT DOCUMENTS

| JP | 2004-072030 A | 3/2004 |
| JP | 2008-218558 A | 9/2008 |
| JP | 2013-258338   | 12/2013 |

*Primary Examiner* — William A Harriston
(74) *Attorney, Agent, or Firm* — Venjuris, P.C.

(57) ABSTRACT

A temperature correction information calculation device includes a model storage unit that stores a model for generating temperature correction information in which a temperature correction value is associated with a cumulative film thickness on an inner wall of a semiconductor manufacturing apparatus that forms a film on a processing target object by a heat treatment at a set temperature corrected according to the cumulative film thickness; a learning determination unit that determines whether or not to update the model when a film forming result by the heat treatment is obtained; a model learning unit that updates the model based on the film forming result when the learning determination unit determines to update the model; and a temperature correction information generation unit that generates the temperature correction information using the model updated by the model learning unit and corrects the set temperature by the temperature correction information.

13 Claims, 18 Drawing Sheets

(56) References Cited

U.S. PATENT DOCUMENTS

| | | | | |
|---|---|---|---|---|
| 5,875,416 | A * | 2/1999 | Kanno | G05D 23/1931 |
| | | | | 702/99 |
| 6,329,643 | B1 * | 12/2001 | Suzuki | F27D 19/00 |
| | | | | 432/241 |
| 2002/0074324 | A1 * | 6/2002 | Wang | C30B 25/16 |
| | | | | 219/390 |
| 2002/0137239 | A1 * | 9/2002 | Koyanagi | H01L 21/31604 |
| | | | | 438/239 |
| 2005/0126489 | A1 * | 6/2005 | Beaman | C23C 16/00 |
| | | | | 118/724 |
| 2008/0213716 | A1 * | 9/2008 | Koyama | H01L 21/67248 |
| | | | | 432/120 |
| 2009/0095422 | A1 * | 4/2009 | Sugishita | H01L 21/67109 |
| | | | | 118/708 |
| 2010/0124726 | A1 * | 5/2010 | Sugishita | H01L 21/67248 |
| | | | | 257/E21.497 |
| 2011/0210117 | A1 * | 9/2011 | Yonenaga | H05B 6/105 |
| | | | | 219/634 |
| 2014/0335693 | A1 * | 11/2014 | Takenaga | C23C 16/46 |
| | | | | 438/694 |

* cited by examiner

FIG. 7

|  | CUMULATIVE FILM THICKNESS [nm] | | | | | |
|---|---|---|---|---|---|---|
|  | tk1 | tk2 | tk3 | tk4 | tk5 | tk6 |
| TEMPERATURE CORRECTION VALUE OF ZONE 1 [°C] | 0.0 | 0.1 | −0.1 | −0.1 | −0.1 | −0.2 |
| TEMPERATURE CORRECTION VALUE OF ZONE 2 [°C] | 0.0 | 0.0 | −0.1 | −0.1 | −0.2 | −0.2 |
| TEMPERATURE CORRECTION VALUE OF ZONE 3 [°C] | 0.0 | −0.1 | −0.3 | −0.3 | −0.4 | −0.3 |
| TEMPERATURE CORRECTION VALUE OF ZONE 4 [°C] | 0.0 | −0.2 | −0.3 | −0.4 | −0.5 | −0.5 |
| TEMPERATURE CORRECTION VALUE OF ZONE 5 [°C] | 0.0 | −0.3 | −0.4 | −0.4 | −0.4 | −0.3 |

FIG. 8A

| | | +1°C FOR ZONE1 [°C] | +1°C FOR ZONE2 [°C] | +1°C FOR ZONE3 [°C] | +1°C FOR ZONE4 [°C] | +1°C FOR ZONE5 [°C] |
|---|---|---|---|---|---|---|
| MONITOR SLOT | WAFER OF ZONE 1 | 1.01 | −0.35 | −0.12 | −0.01 | −0.03 |
| | WAFER OF ZONE 2 | −0.22 | 0.88 | 0.33 | −0.02 | 0.01 |
| | WAFER OF ZONE 3 | 0.03 | 0.31 | 0.70 | 0.17 | −0.07 |
| | WAFER OF ZONE 4 | −0.01 | −0.14 | 0.42 | 0.94 | 0.14 |
| | WAFER OF ZONE 5 | 0.01 | 0.01 | −0.12 | 0.14 | 0.79 |

FIG. 8B

| | VARIATION IN FILM THICKNESS WHEN TEMPERATURE VARIES BY 1°C [nm] |
|---|---|
| ZONE 1 | A |
| ZONE 2 | B |
| ZONE 3 | C |
| ZONE 4 | D |
| ZONE 5 | E |

| CUMULATIVE FILM THICKNESS | FILM THICKNESS (WAFER) | FILM THICKNESS VARIATION | TEMPERATURE VARIATION |
|---|---|---|---|
| 0 μm | 50nm | 0 | 0 |
| 1 μm | 49nm | −1 | −1 |
| ⋮ | ⋮ | ⋮ | ⋮ |
| 10 μm | 48nm | −2 | −2 |

FIG. 15 ex1) INFERENCE FROM PROCESS RESULT: IN-PLANE DISTRIBUTION OF FILM THICKNESS VARY SIGNIFICANTLY

IT MAY BE INFERRED THAT THERE IS DISTURBANCE -> OFF(NEW)

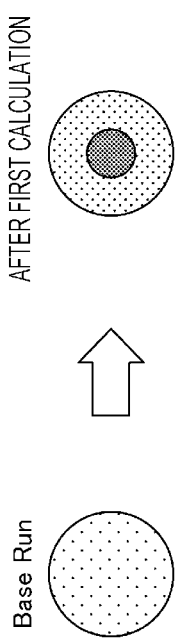

(a)

ex2) INFERENCE FROM OTHER FACTORS: HARDWARE SUCH AS TEMPERATURE SENSOR WAS REPLACED BEFORE PROCESS EXECUTION

II. IT MAY BE INFERRED THAT THERE IS NO DISTURBANCE AND ACCURACY OF MODEL IS LOW -> ON(CONTINUED):

ex) IT MAY BE INFERRED THAT THERE IS NO HOPE OF IMPROVEMENT WHEN CALCULATED VALUE RATHER DEVIATE FROM TARGET

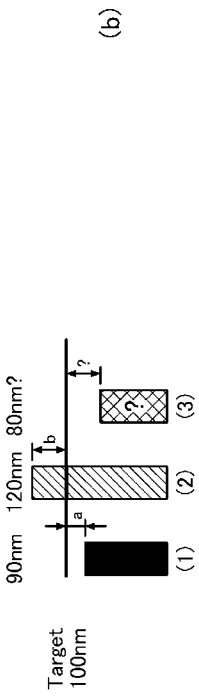

(b)

FIG. 18A (a) For example, it may be determined that there is disturbance other than the process in the following cases.
 a) Hardware such as temperature sensor was replaced before heat treatment.
 b) The user edited the process recipe with respect to the set temperature to perform the heat treatment.
 c) The monitored position has been changed.
 d) More than a certain amount of time such as half a year has passed from the last update of the model to the implementation of this heat treatment.
 e) The surface state (with or without coating) of the dummy wafer does not match.
 f) The magnification (output) of a top plate heater or cooling fan is extremely high.

FIG. 18B (b) For example, it may be determined that there is disturbance in a case of the following process result.
 g) There is an extreme change in the in-plane distribution of the film thickness of the semiconductor wafer W or in the uniformity between the semiconductor wafers.
 h) There is measurement noise (abnormal point) upon the measurement of the film thickness.

FIG. 18C (c) For example, it may be determined that the accuracy of the model is insufficient in the following case.
 i) The film forming result deteriorated before and after the calculation of the temperature correction table.

TEMPERATURE CORRECTION INFORMATION CALCULATION DEVICE, SEMICONDUCTOR MANUFACTURING APPARATUS, STORAGE MEDIUM, AND TEMPERATURE CORRECTION INFORMATION CALCULATION METHOD

CROSS-REFERENCE TO RELATED APPLICATIONS

This application is based on and claims priority from Japanese Patent Application No. 2021-096159, filed on Jun. 8, 2021 with the Japan Patent Office, the disclosure of which is incorporated herein in its entirety by reference.

TECHNICAL FIELD

The present disclosure relates to a temperature correction information calculation device, a semiconductor manufacturing apparatus, a storage medium, and a temperature correction information calculation method.

BACKGROUND

In a semiconductor manufacturing process, for example, a heat treatment system is used to perform a film forming processing of a semiconductor wafer. In the heat treatment system, processing conditions controlled by a semiconductor manufacturing apparatus such as the set temperature, pressure, and gas flow rate are determined according to a process recipe corresponding to a process. When the semiconductor manufacturing apparatus repeats a heat treatment, for example, a film is formed on the semiconductor wafer, but deposits also adhere to the inner wall surface of the semiconductor manufacturing apparatus. If the cumulative film thickness of these deposits increases, the temperature inside the furnace falls and it will become impossible to form a film on the semiconductor wafer to a desired film thickness even though the semiconductor manufacturing apparatus controls the heat treatment to the set temperature according to the process recipe.

Hence, a heat treatment system for correcting the set temperature according to the cumulative film thickness has been known (see, e.g., Japanese Patent Laid-Open Publication No. 2008-218558). Japanese Patent Laid-Open Publication No. 2008-218558 discloses a technique to generate temperature correction information in which the correction amount of the set temperature is associated with the cumulative film thickness.

SUMMARY

An aspect of the present disclosure is a temperature correction information calculation device of a semiconductor manufacturing apparatus, the temperature correction information device including a model storage unit that stores a model for generating temperature correction information in which a temperature correction value is associated with a cumulative film thickness that is accumulated on an inner wall of the semiconductor manufacturing apparatus that forms a film on a processing target object by a heat treatment at a set temperature corrected according to a cumulative film thickness, a learning determination unit that determines whether or not to update the model when a film forming result by the heat treatment is obtained, a model learning unit that updates the model based on the film forming result on the processing target object when the learning determination unit determines to update the model, and a temperature correction information generation unit that generates the temperature correction information using the model updated by the model learning unit and to correct the set temperature by the temperature correction information.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is an example of a temperature correction table.

FIGS. 8A and 8B are an example of a diagram for schematically illustrating a model stored in a model storage unit.

FIG. 15 is an example of a diagram for explaining a method of determining whether a learning function is on or off.

FIGS. 18A to 18C are an example of a diagram enumerating a specific content of the determination of ON or OFF of the learning function of the model.

DESCRIPTION OF EMBODIMENT

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. As an example of an embodiment for implementing the present disclosure, a heat treatment system and a temperature correction information calculation method performed by the heat treatment system will be described with reference to the drawings.

[Outline of Temperature Correction with Respect to Cumulative Film Thickness]

A heat treatment system corrects the set temperature set in a process recipe using a temperature correction table, and the temperature correction table is generated by a model to be described later. Then, the heat treatment system has a function of learning the film forming result to update the model. However, it was not easy for a user to determine whether to switch on or off the learning function of the model.

The heat treatment system of the present embodiment may automatically switch on or off the learning function of the model in consideration of the presence or absence of disturbance or the accuracy of the model. Hereinafter, the details will be described.

[Entire Configuration of Heat Treatment System Including Semiconductor Manufacturing Apparatus]

Figure 1:
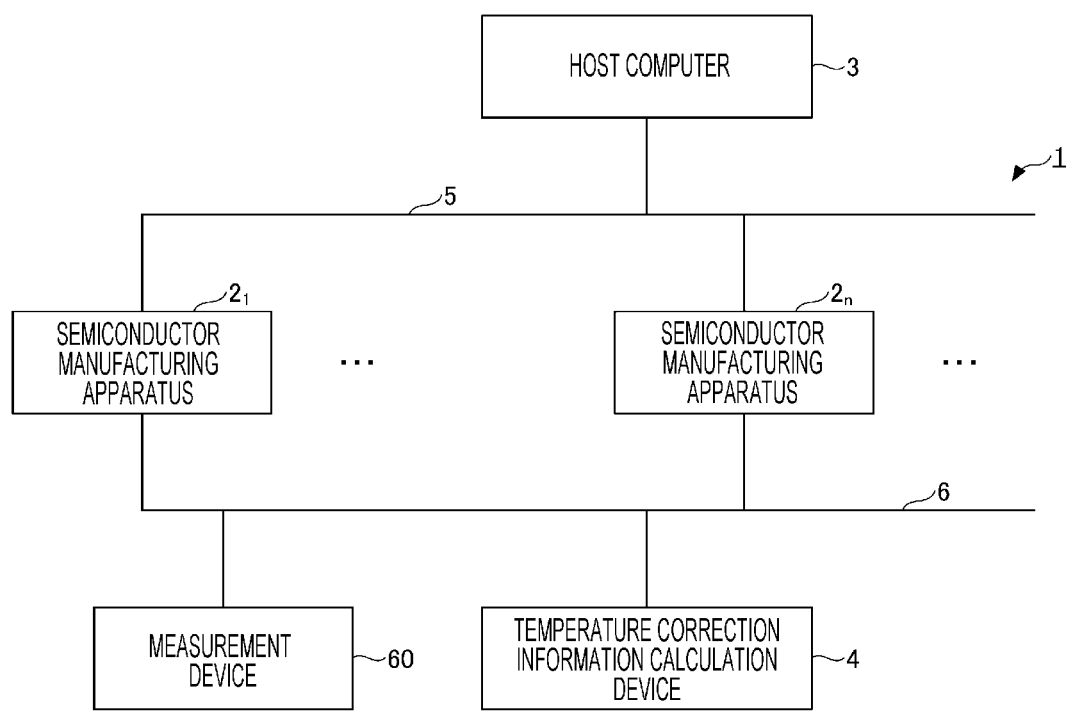
FIG. 1 is an example of a schematic configuration diagram of a heat treatment system.

FIG. 1 illustrates an example of a schematic configuration diagram of a heat treatment system. As illustrated in FIG. 1, the heat treatment system 1 of the present embodiment includes a plurality of semiconductor manufacturing apparatuses 2 ($2_1$ to $2_n$ in FIG. 1), a host computer 3, a temperature correction information calculation device 4, and networks 5 and 6 interconnecting the above enumerated ones. Further, the heat treatment system 1 includes, for example, a measurement device 60 which measures the state (e.g., film state) of a processing target object (hereinafter referred to as a semiconductor wafer) processed by the semiconductor manufacturing apparatus 2.

The semiconductor manufacturing apparatus 2 may include various devices depending on processes. Examples thereof include a film forming device that performs a processing of forming a thin film on the semiconductor wafer, an oxidation device that performs an oxidation processing of oxidizing a surface area of the semiconductor wafer, and a diffusion device that performs a processing of diffusing (doping) impurities into the surface area of the semiconductor wafer. Hereinafter, as an example of the semiconductor manufacturing apparatus, a case of a batch type vertical heat treatment apparatus illustrated in FIG. 2 will be described by way of example. Further, in the present embodiment, as a processing to the semiconductor wafer, a film forming processing will be described by way of example.

Figure 2:
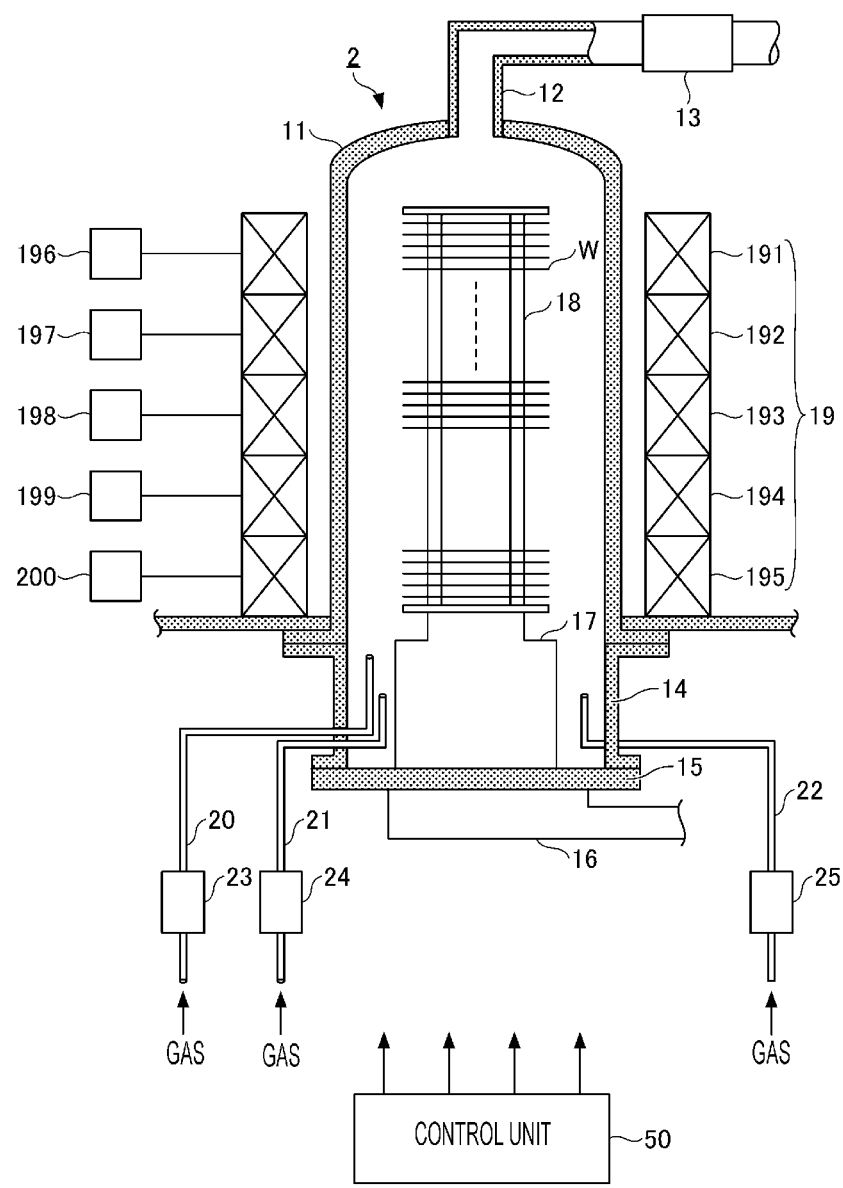
FIG. 2 is an example of a schematic cross-sectional view of a semiconductor manufacturing apparatus.

FIG. 2 is an example of a schematic cross-sectional view of the semiconductor manufacturing apparatus 2. As illustrated in FIG. 2, the semiconductor manufacturing apparatus 2 includes a substantially cylindrical reaction tube 11. The reaction tube 11 is arranged so that the longitudinal direction thereof faces the vertical direction. The reaction tube 11 is formed of a material having excellent heat resistance and corrosion resistance, for example, quartz.

An exhaust pipe 12 is airtightly connected to the top of the reaction tube 11 to exhaust a gas in the reaction tube 11. The exhaust pipe 12 is provided with a pressure regulator 13 including a valve and a vacuum pump, and regulates the inside of the reaction tube 11 to a desired pressure (degree of vacuum).

A substantially cylindrical manifold 14 is provided at the bottom of the reaction tube 11. The upper end of the manifold 14 is airtightly bonded to the lower end of the reaction tube 11.

A lid body 15 is disposed below the manifold 14 (reaction tube 11). The lid body 15 is configured to be movable up and down by a boat elevator 16. The lower side (furnace opening portion) of the manifold 14 (reaction tube 11) is closed when the lid body 15 is raised by the boat elevator 16, and the lower side (furnace opening portion) of the reaction tube 11 is opened when the lid body 15 is lowered by the boat elevator 16.

A wafer boat 18 is provided above the lid body 15 via a heat insulating cylinder (insulator) 17. The wafer boat 18 is a wafer holder that accommodates (holds) a processing target object, for example, a semiconductor wafer W. In the present embodiment, a plurality of (e.g., 150) semiconductor wafers W may be accommodated at a predetermined interval in the vertical direction. Then, the semiconductor wafer W is accommodated in the wafer boat 18 and the lid body 15 is raised by the boat elevator 16, so that the semiconductor wafer W is loaded into the reaction tube 11.

A heater unit 19 including, for example, a resistance heating element is provided around the reaction tube 11 so as to surround the reaction tube 11. The inside of the reaction tube 11 is heated to a predetermined temperature by the heater unit 19 and as a result, the semiconductor wafer W is heated to the predetermined temperature.

Figure 3:
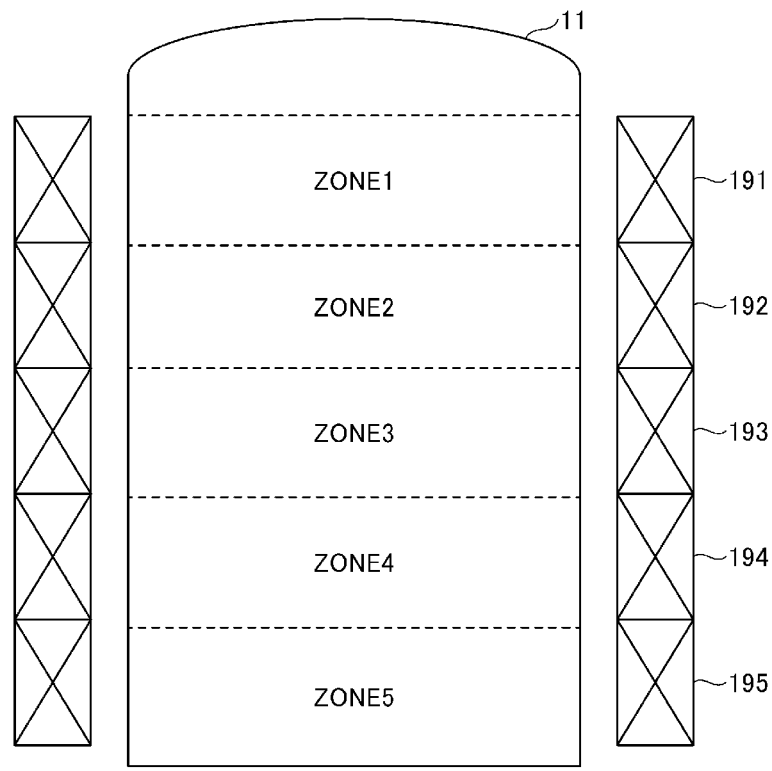
FIG. 3 is an example of partitioned zones.

The heater unit 19 includes, for example, heaters 191 to 195 arranged in five stages. Power is independently supplied to each of the heaters 191 to 195 from power controllers 196 to 200, respectively, to enable independent control thereof. As such, the inside of the reaction tube 11 is divided into five zones (ZONE 1 to ZONE 5) as illustrated in FIG. 3 by the heaters 191 to 195. The number of divided zones is not limited to five, but may be two or more, and it may be not necessary to divide the inside into zones.

Further, the manifold 14 is provided with a plurality of gas supply pipes to supply a gas into the reaction tube 11. In the present embodiment, three gas supply pipes 20 to 22 are provided. A source gas and carrier gas for film formation are supplied to each of the gas supply pipes 20 to 22 through flow rate regulators 23 to 25 each containing a mass flow controller (MFC) for adjusting the gas flow rate.

Five temperature sensors (thermocouples) (not illustrated) are vertically arranged in a line on the inner wall of the reaction tube 11. In order to prevent metal contamination of the semiconductor wafer W, these temperature sensors are covered with a quartz pipe, and are arranged respectively in the respective zones illustrated in FIG. 3.

The semiconductor manufacturing apparatus 2 includes a control unit 50 for controlling processing parameters such as the temperature, gas flow rate, and pressure of the processing atmosphere in the reaction tube 11. The control unit 50 receives output signals from temperature and pressure sensors (not illustrated), and outputs control signals to the power controllers 196 to 200 of the heaters 191 to 195, the pressure regulator 13, and the flow rate regulators 23 to 25.

[Example of Hardware Configuration of Control Unit]

Figure 4:
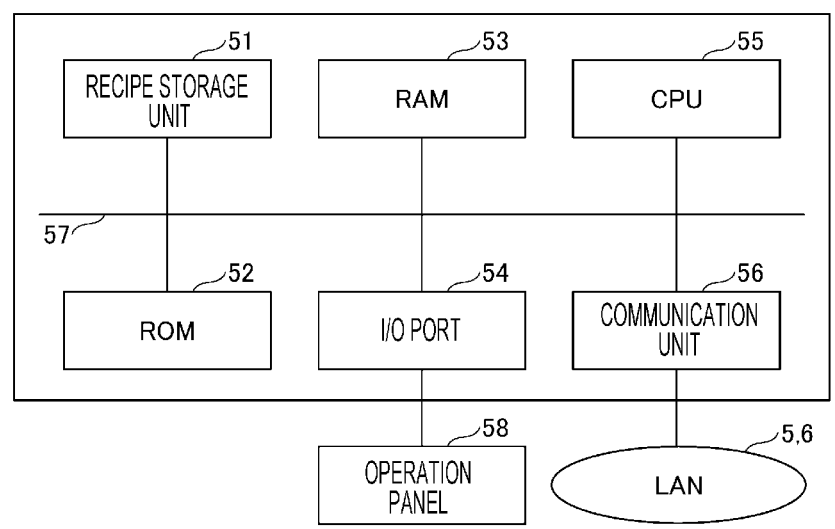
FIG. 4 is an example of a configuration diagram of a control unit.

FIG. 4 is a diagram illustrating a configuration example of the control unit 50. The control unit 50 includes a recipe storage unit 51, a ROM 52, a RAM 53, an I/O port 54, a CPU 55, a communication unit 56, and a bus 57 interconnecting the above enumerated ones.

The recipe storage unit 51 stores a process recipe that determines a control sequence according to the type of a film forming processing executed in the semiconductor manufacturing apparatus 2. The process recipe is processing information prepared for each processing (process) actually performed by an operator. The process recipe prescribes a change in the temperature of each unit, a change in the pressure inside the reaction tube 11, timings to start and stop the supply of a gas, and the supply amount of a gas, starting from loading of the semiconductor wafer W into the reaction tube 11 until unloading of the completely processed semiconductor wafer W. By this process recipe, the set film thickness or set temperature of each apparatus unit by that heat treatment may be specified. In a case of a conventional batch type heat treatment apparatus, one process recipe is prepared for all the semiconductor wafers W, but in the present embodiment, a predetermined process recipe is prepared for each zone illustrated in FIG. 3 so that the processing result of the semiconductor wafers W is uniform.

Further, this process recipe includes an optimized value calculation recipe in which the set temperature of each apparatus unit is corrected to an appropriate temperature (optimized value) based on a temperature correction table, and the resulting corrected temperature is used as the set temperature. Therefore, when the semiconductor manufacturing apparatus 2 performs a heat treatment based on the optimized value calculation recipe, the optimized value of the set temperature of each of ZONE 1 to ZONE 5 is calculated, and the calculated optimized value is used as the set temperature.

Accordingly, the set temperature is corrected by the semiconductor manufacturing apparatus 2, but the temperature correction information calculation device 4 may provide the semiconductor manufacturing apparatus 2 with the process recipe in which the set temperature is corrected based on a temperature correction table. In addition, any other device may correct the set temperature, and the semiconductor manufacturing apparatus 2 may finally execute the process recipe with the corrected set temperature.

The ROM 52 is configured with an EEPROM, a flash memory, or a hard disk, and is a recording medium that stores an operation program of the CPU 55.

The RAM 53 functions as a work area of the CPU 55. The RAM 53 stores, for example, the number of processing execution times in the semiconductor manufacturing apparatus 2. The cumulative film thickness of deposits adhered inside the semiconductor manufacturing apparatus 2 may be specified by the number of processing execution times and the set film thickness stored in the recipe storage unit 51.

I/O port 54 supplies measurement signals related to the temperature, pressure, and gas flow rate to the CPU 55, and outputs control signals output by the CPU 55 to each unit (the power controllers 196 to 200, the flow rate regulators 23 to 25, and the pressure regulator 13). Further, an operation panel 58 by which the operator operates the semiconductor manufacturing apparatus 2 is connected to the I/O port 54.

The CPU 55 constitutes the central part of the control unit 50, executes the operation program stored in the ROM 52, and controls an operation of the semiconductor manufacturing apparatus 2 according to an instruction from the operation panel 58 or according to the process recipe stored in the recipe storage unit 51.

The communication unit 56 takes charge of communication between the semiconductor manufacturing apparatus 2, the host computer 3, and the temperature correction information calculation device 4 via the LANs 5 and 6. The bus 57 transmits information between the respective units.

The host computer 3 is a device that manages the entirety of each of the semiconductor manufacturing apparatuses 2 and executes a processing of instructing each semiconductor manufacturing apparatus 2 to execute a heat treatment. It is assumed that the host computer 3 has a known configuration, and illustration thereof is omitted.

[Example of Hardware Configuration of Temperature Correction Information Calculation Device]

Figure 5:
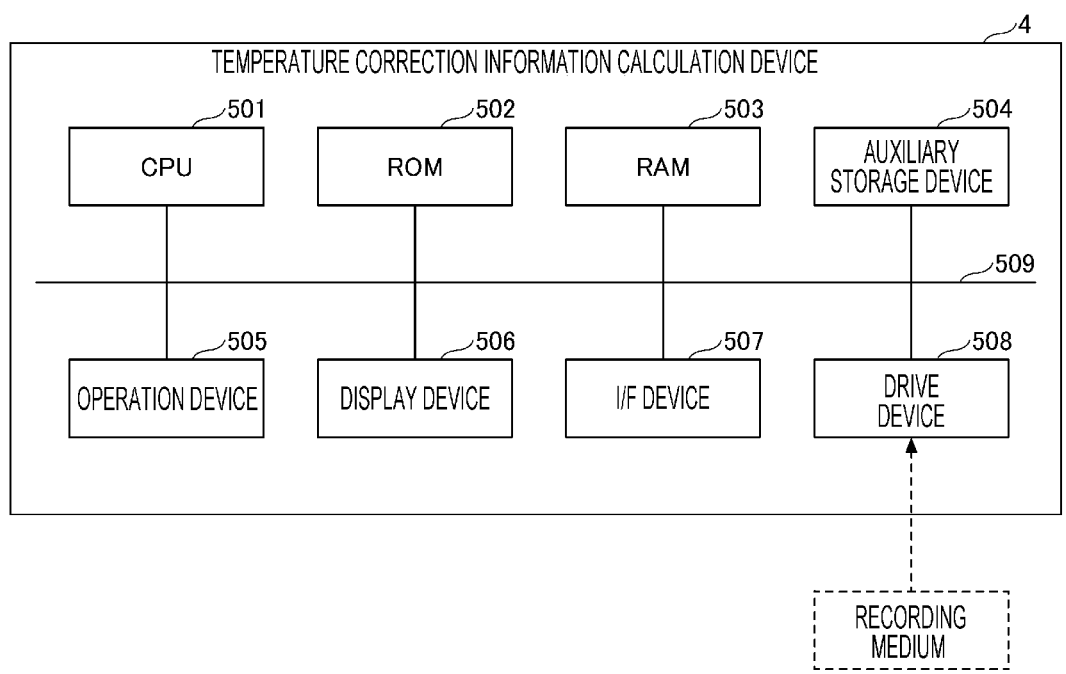
FIG. 5 is an example of a hardware configuration diagram of a temperature correction information calculation device.

FIG. 5 illustrates an example of a hardware configuration diagram of the temperature correction information calculation device 4. The temperature correction information calculation device 4 executes a processing of generating a temperature correction table depending on the cumulative film thickness (the number of film forming times) in order to reduce the difference between the furnace inside temperature and the set temperature caused by the effect of the cumulative film thickness in each of the semiconductor manufacturing apparatuses 2. Further, the temperature correction information calculation device 4 updates a model used for the generation of the temperature correction table according to the film forming result. The details of the model will be described later.

The temperature correction information calculation device 4 includes a central processing unit (CPU) 501, a read only memory (ROM) 502, and a random access memory (RAM) 503. The CPU 501, the ROM 502 and the RAM 503 form a so-called computer. Further, the temperature correction information calculation device includes an auxiliary storage device 504, an operation device 505, a display device 506, an interface (I/F) device 507, and a drive device 508. The respective hardware components of the temperature correction information calculation device 4 are connected to each other via a bus 509.

The CPU 501 executes various programs installed in the auxiliary storage device 504.

The ROM 502 is a nonvolatile memory and functions as a main storage device. The ROM 502 stores, for example, various programs and data required for the CPU 501 to execute various programs installed in the auxiliary storage device 504.

The RAM 503 is a volatile memory such as a dynamic random access memory (DRAM) or a static random access memory (SRAM), and functions as a main storage device. The RAM 503 provides a work area in which various programs installed in the auxiliary storage device 504 are developed when executed by the CPU 501.

The auxiliary storage device 504 is a nonvolatile mass storage device that stores various programs. The auxiliary storage device 504 may be a nonvolatile mass storage medium such as a hard disk drive (HDD) or a solid state drive (SSD).

The operation device 505 is an input device used by the operator when inputting various instructions to the temperature correction information calculation device 4. The display device 506 is a display device that displays internal information of the temperature correction information calculation device 4 and information acquired from the outside.

The I/F device 507 is a connection device that is connected to the LAN 6 for communication with the control unit 50 of the semiconductor manufacturing apparatus 2. The I/F device 507 also communicates with the measurement device 60 or the host computer 3.

The drive device 508 is a device for setting a recording medium. The recording medium includes a medium that optically, electrically, or magnetically records information such as a CD-ROM, a flexible disk, or a magneto-optical disk. Further, the recording medium may include a semiconductor memory in which information is electrically recorded, such as a ROM or a flash memory.

Various programs installed in the auxiliary storage device 504 are installed, for example, by setting a distributed recording medium in the drive device 508 and reading out various programs recorded on the recording medium by the drive device 508. Alternatively, various programs installed in the auxiliary storage device 504 may be installed by being downloaded from a predetermined server.

[About Function of Temperature Correction Information Calculation Device]

Figure 6:
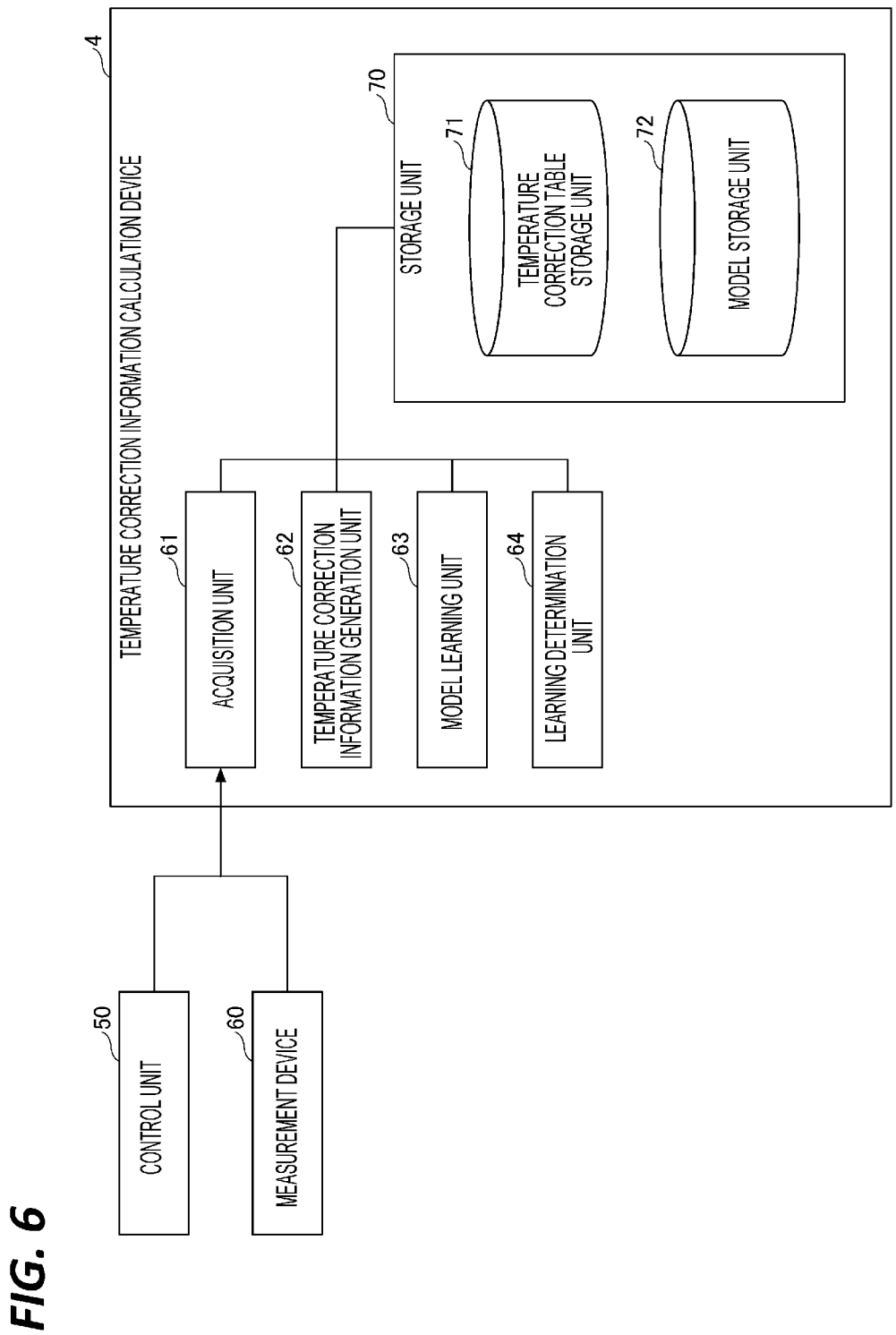
FIG. 6 is an example of a functional block diagram for explaining a functional configuration of the temperature correction information calculation device by dividing it into blocks.

Next, information included in the temperature correction information calculation device 4 and a functional configuration thereof will be described with reference to FIG. 6. FIG. 6 is an example of a functional block diagram for explaining a functional configuration of the temperature correction information calculation device 4 by dividing it into blocks.

The temperature correction information calculation device 4 includes an acquisition unit 61, a temperature correction information generation unit 62, a model learning unit 63, and a learning determination unit 64. These functions of the temperature correction information calculation device 4 are functions or means realized when the CPU 501 illustrated in FIG. 5 executes a program developed from the auxiliary storage device 504 to the RAM 503.

The acquisition unit 61 acquires log information regarding a heat treatment process of the semiconductor wafer W executed based on the process recipe from the control unit 50 of the semiconductor manufacturing apparatus 2. Further, the acquisition unit 61 may acquire the monitored film thickness of the semiconductor wafer W which is monitored from the measurement device 60. Since the number of processing execution times in the semiconductor manufacturing apparatus 2 may be known from the log information, the cumulative film thickness of deposits adhered inside the semiconductor manufacturing apparatus 2 may be specified by the number of processing execution times and the set film thickness stored in the process recipe.

The temperature correction information generation unit 62 generates a temperature correction table by using a model to be described later in a relationship between the set temperature included in the log information and the monitored film thickness measured by the measurement device 60.

The model learning unit 63 updates the model stored in the model storage unit 72. The update of the model is to change the model to more accurately represent a relationship between the set temperature and the film thickness in the semiconductor manufacturing apparatus 2 based on the film forming result and a target film thickness. In this sense, update may be referred to as learning, and may also be occasionally referred to as learning in the present embodiment.

The learning determination unit 64 determines whether or not it is appropriate to update the model based on the film forming result, and switches the model learning unit 63 to update the model (ON), or not to update the model (OFF).

Further, the temperature correction information calculation device 4 includes a storage unit 70 formed in the RAM 503 or the auxiliary storage device 504. The storage unit 70 includes a temperature correction table storage unit 71 and a model storage unit 72.

FIG. 7 is an example of a temperature correction table. A temperature correction table represents a relationship between the cumulative film thickness of deposits adhered inside the apparatus and the correction amount of the temperature for each temperature (set temperature) inside the semiconductor manufacturing apparatus 2. In the temperature correction table of FIG. 7, the temperature inside the semiconductor manufacturing apparatus 2 is set to a predetermined temperature, and the temperature correction value in a case where deposits having a predetermined cumulative film thickness adhere inside the apparatus is determined for each zone.

Referring to FIG. 7 as an example, the film thickness of tk1 [nm] is formed on the semiconductor wafer in the initial state before executing the process recipe. tk1 is, for example, 100 nm, but varies according to the process recipe. The process recipe includes a film forming processing of 6 times. The film forming processing of 6 times is a heat treatment of the first cycle. A film thickness (Δtk) determined by the film forming processing of 1 time is formed. The cumulative film thickness increases such as tk2=tk1+Δtk, tk3=tk2+Δtk, ..., and the film thickness of tk6+Δtk is obtained at the sixth time. The number of times of the film forming processing included in the heat treatment of the first cycle may be several times, and the film thickness formed by the film forming processing of 1 time varies according to the process recipe.

When the semiconductor manufacturing apparatus 2 corrects the set temperature of ZONE 1, for example, in a state where the cumulative film thickness is tk2 [nm], "the set temperature of the process recipe+0.1" ° C. is calculated as a corrected set temperature.

The temperature correction table is an example of information storing the temperature correction value for correcting the set temperature, and the storage format of the temperature correction value is not limited to a table or table format. For example, the temperature correction table may be in a function format or a graph format.

When the set temperature and the cumulative film thickness differ from the values specified in the temperature correction table, the semiconductor manufacturing apparatus 2 may cope with it by interpolation.

FIGS. 8A and 8B are a diagram for schematically illustrating a model stored in the model storage unit 72. Although the model is prepared for each set temperature, FIGS. 8A and 8B illustrate the model for an arbitrary set temperature.

In the model of FIG. 8A, a variation in the temperature of the semiconductor wafer W when the set temperature varies by 1° C. is determined for each zone. That is, the temperature of the semiconductor wafer may not be completely equal to the set temperature according to the temperature distribution of the reaction tube 11. The actual temperature of the semiconductor wafer W when the set temperature varies by 1° C. is calculated by the model of FIG. 8A. The model of FIG. 8A represents a variation in the temperature of each slot when the temperature varies by +1° C. for each zone. That is, when the temperature of one zone is changed, the temperature of another zone is also changed. This temperature calculated with the model of FIG. 8A is used when referring to the model of FIG. 8B.

In the model of FIG. 8B, a variation in the film thickness when the temperature varies by 1° C. is determined for each zone. The film thickness is formed on the semiconductor wafer W according to the actual temperature of the semiconductor wafer W under a heat treatment (other parameters such as the gas type and the pressure being constant) and the heat treatment time. The model of FIG. 8B represents that the actual temperature of the semiconductor wafer W is associated with the film thickness based on various knowledges. For example, in Zone 1, a variation in the film thickness when the temperature varies by 1° C. (this temperature being corrected in FIG. 8A) is A [nm].

A generation example of the temperature correction table for zone 1 using the model of FIG. 8B will be described. For the generation of the temperature correction table, for example, the following evaluation function is used.

Evaluation Function (J)=f (residual with a target film thickness, a model representing a variation in the temperature and in the film thickness, a variation in the temperature)

With the constraint conditions in which the heater power is not saturated and the temperature constraint width specified by the user is not exceeded, the optimum value is the combination of variations in the temperature in which the evaluation function J is minimized within the constraint range. The details of a method of generating the temperature correction table will be described later.

Accordingly, the two models in FIGS. 8A and 8B are desirable to be as accurate as possible since they are referenced when generating the temperature correction table. Therefore, the temperature correction information calculation device 4 has a function of learning the model. The model learning unit 63 updates (learns) the model based on the difference between the monitored film thickness and the target film thickness. As a way of thinking, the larger the difference between the target film thickness and the monitored film thickness as the film forming result, the greater the variation in the temperature of the semiconductor wafer W when the temperature varies by 1° C. in the model of FIG. 8A, and the greater the variation in the film thickness when the temperature varies by 1° C. in the model of FIG. 8B.

More specifically, the model learning unit 63 updates the two models by applying the difference between the monitored film thickness and the target film thickness to an extended Kalman filter. Since a method of updating the model is not a feature of the present application, details are omitted. Hereinafter, it is assumed that a model includes the two models of FIGS. 8A and 8B unless otherwise specified.

[Outline of Temperature Correction Function Depending ON Cumulative Film Thickness]

Figure 9:
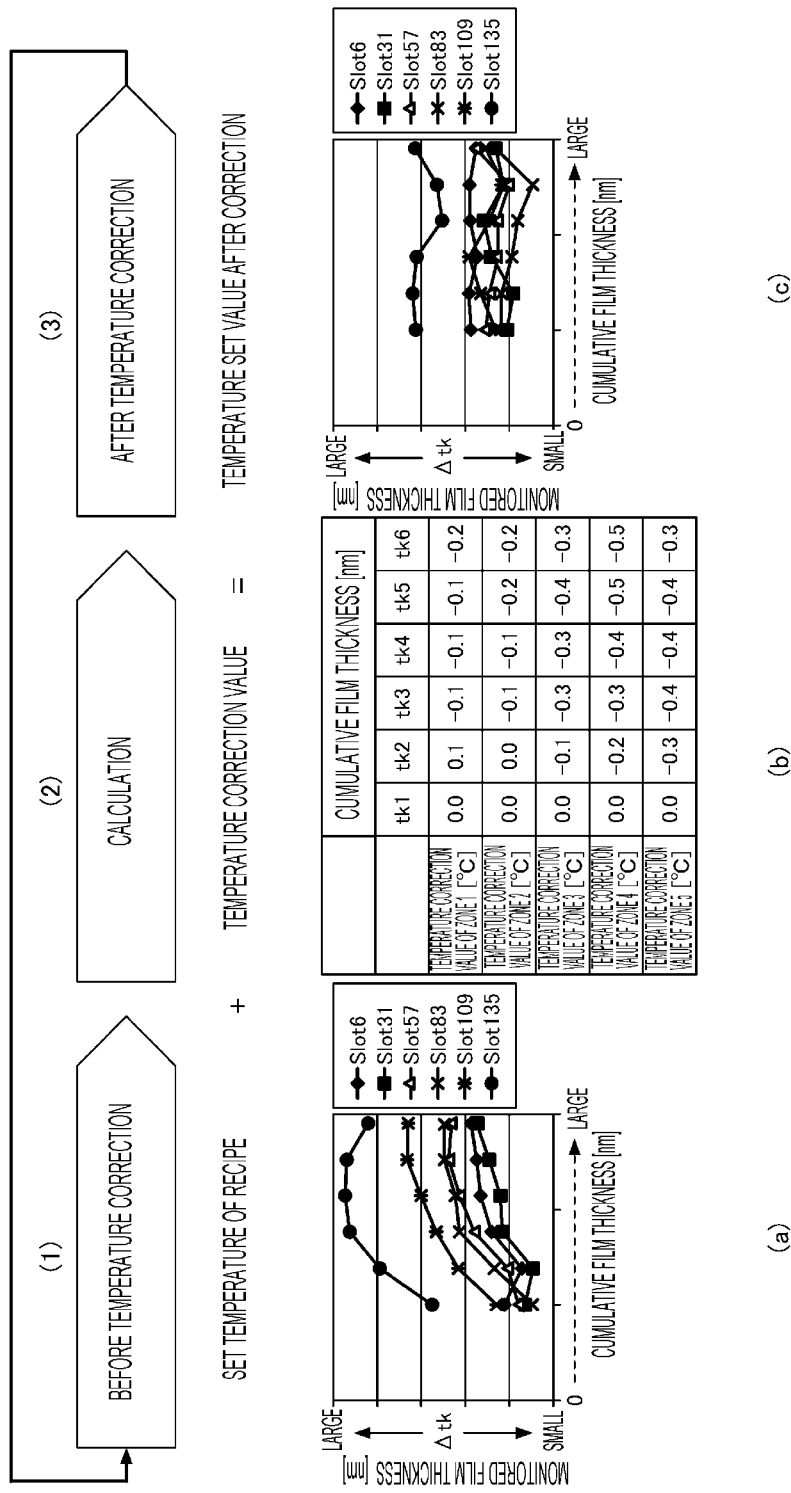
FIG. 9 is an example of the film forming result in a case of carrying out a film forming processing of using the temperature correction table to perform temperature correction according to the cumulative film thickness.

FIG. 9 is a diagram for explaining an example of the film forming result in a case of a film forming processing of using the temperature correction table to perform temperature correction according to the cumulative film thickness.

(1) First, a heat treatment is performed by the semiconductor manufacturing apparatus 2 in the absence of the temperature correction table. In FIG. 9, the heat treatment "before temperature correction" corresponds thereto. The heat treatment "before temperature correction" is referred to as initial heat treatment (film forming processing of 6 times). The film thickness formed by the film forming processing of 1 time is Δtk [nm]. The semiconductor manufacturing apparatus 2 performs a film forming processing by dividing it into several times in order to obtain the film formation of the film-thickness (e.g., tk6+Δtk [nm]) set in the process recipe. Part (a) of FIG. 9 illustrates the film forming result obtained by the film forming processing of the initial heat treatment.

In part (a) of FIG. 9, the horizontal axis represents the cumulative film thickness, and the vertical axis represents the monitored film thickness. The monitored film thickness is non-uniform around Δtk. In part (a) of FIG. 9, the first cycle includes the film forming processing of 6 times. The monitored film thickness formed by the film forming processing of 1 time is illustrated with respect to the cumulative film thickness accumulated by the film forming processing of 6 times. Further, a plurality of graphs in part (a) of FIG. 9 illustrate the monitored film thicknesses of the semiconductor wafers W at different vertical positions in the wafer boat 18. That is, since the gas concentration varies according to the height in the reaction tube 11, the semiconductor wafers W at different heights are extracted in advance for monitoring. The semiconductor wafer W on which the monitored film thickness is measured is a representative semiconductor wafer W of each zone.

As the number of times of the film forming processing increases, the cumulative film thickness on the inner wall surface of the semiconductor manufacturing apparatus also increases. If the cumulative film thickness increases, the furnace inside temperature is lowered even though it is controlled to the same processing temperature, and it becomes impossible to form a thin film having a desired film thickness on the semiconductor wafer W. In part (a) of FIG. 9, the monitored film thickness before temperature correction tends to gradually increase as the cumulative film thickness increases.

(2) The temperature correction information generation unit 62 generates a temperature correction table illustrated in part (b) of FIG. 9 by using the models of FIGS. 8A and 8B in a relationship between the set temperature included in the log information and the monitored film thickness acquired from the measurement device 60. The generation of the temperature correction table immediately after the initial heat treatment is referred to as a first calculation.

In part (b) of FIG. 9, a processing corresponding to "calculation" is the generation of the temperature correction table. However, the update of the model is included in the second and subsequent calculations after the temperature correction table is generated. Since temperature correction is not performed in the initial heat treatment (since there is a high possibility of an appropriate monitored film thickness being not obtained), the model is not updated in the first calculation.

(3) A heat treatment is performed by the semiconductor manufacturing apparatus 2 using the temperature correction table. In FIG. 9, the heat treatment "after temperature correction" corresponds thereto. Part (c) of FIG. 9 illustrates the film forming result obtained by the film forming processing in which the set temperature is corrected by the temperature correction table. In part (c) of FIG. 9, even if the cumulative film thickness increases, the monitored film thickness tends to be stable due to temperature correction.

The model learning unit 63 may use the monitored film thickness of (3) to update the model. Whether or not to update the model is determined according to a case where the difference between the target film thickness and the film forming result is large (a case where the criterion is not satisfied as will be described later) and according to disturbance and the accuracy of the model. Thus, the model may be updated in the second and subsequent calculations.

[Generation of Temperature Correction Table]

Figure 10:
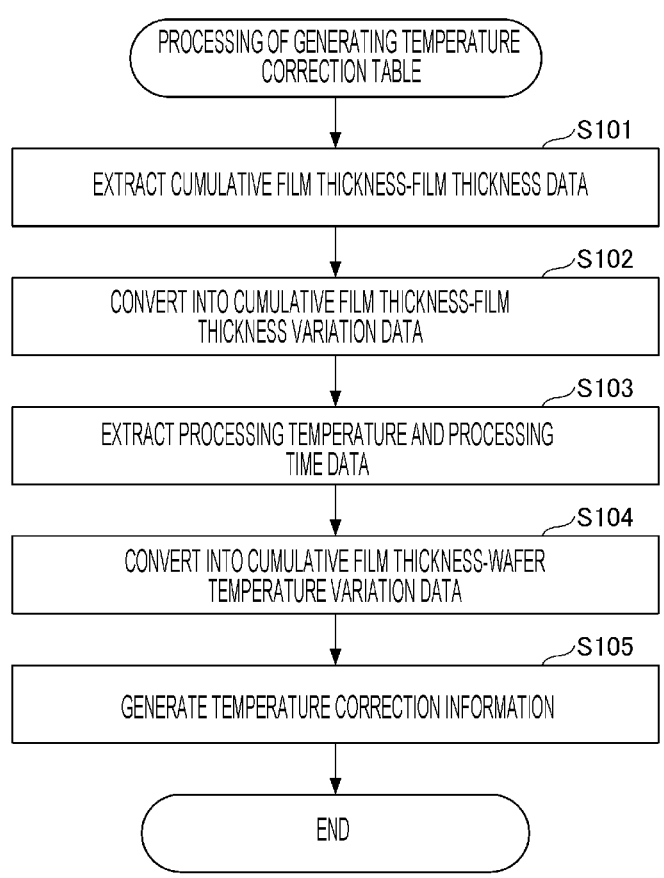
FIG. 10 is an example of a flowchart for explaining a method of generating the temperature correction table.

FIG. 10 is a flowchart for explaining a method of generating the temperature correction table.

Figures 11A, 11B:
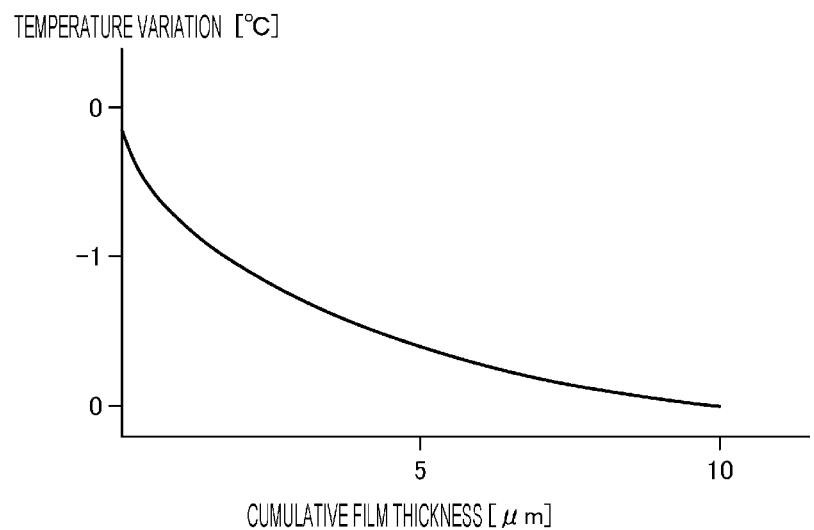
FIGS. 11A and 11B are an example of a diagram for explaining the cumulative film thickness data and the monitored film thickness of a film formed on a semiconductor wafer.

First, the temperature correction information generation unit 62 extracts, from the log information acquired by the acquisition unit 61, the cumulative film thickness data and the monitored film thickness formed on the semiconductor wafer W in association with each other as illustrated in FIG. 11A (S101).

Next, the temperature correction information generation unit 62 converts the extracted associated cumulative film thickness data and the film thickness data (cumulative film thickness data—film thickness data) into the "cumulative film thickness data—film thickness variation data" as illustrated in the film thickness variation of FIG. 11A (S102).

Subsequently, the temperature correction information generation unit 62 extracts the processing temperature and processing time data of the film forming processing from the log information (S103).

Next, the temperature correction information generation unit 62 converts the cumulative film thickness data—film thickness variation data into the cumulative film thickness data—wafer temperature variation data using the model (S104). For example, as for the wafer temperature variation in the film forming processing of the present embodiment, as illustrated in the temperature variation of FIG. 11A, the film thickness decreases by 1 nm when the temperature of a wafer is lowered by 1° C.

Subsequently, the temperature correction information generation unit 62 generates temperature correction information (temperature correction table) by optimization using the evaluation function J as described above (S105). The temperature correction table is obtained by converting the graph of FIG. 11B into a table.

The temperature correction table is generated as described above. The temperature correction table is generated each time regardless of whether or not a model is to be generated (learning ON/OFF). That is, the temperature correction table has a different value from that before calculation whether the learning is ON or OFF. When the model is not updated (learning OFF), the temperature correction table is newly calculated using the initial model and the recent film forming result (+ process log). When the model is updated (learning ON), the temperature correction table is newly calculated using the updated model and the recent film forming result (+ process log).

[Relationship Between Model and Temperature Correction Table]

Figure 12:
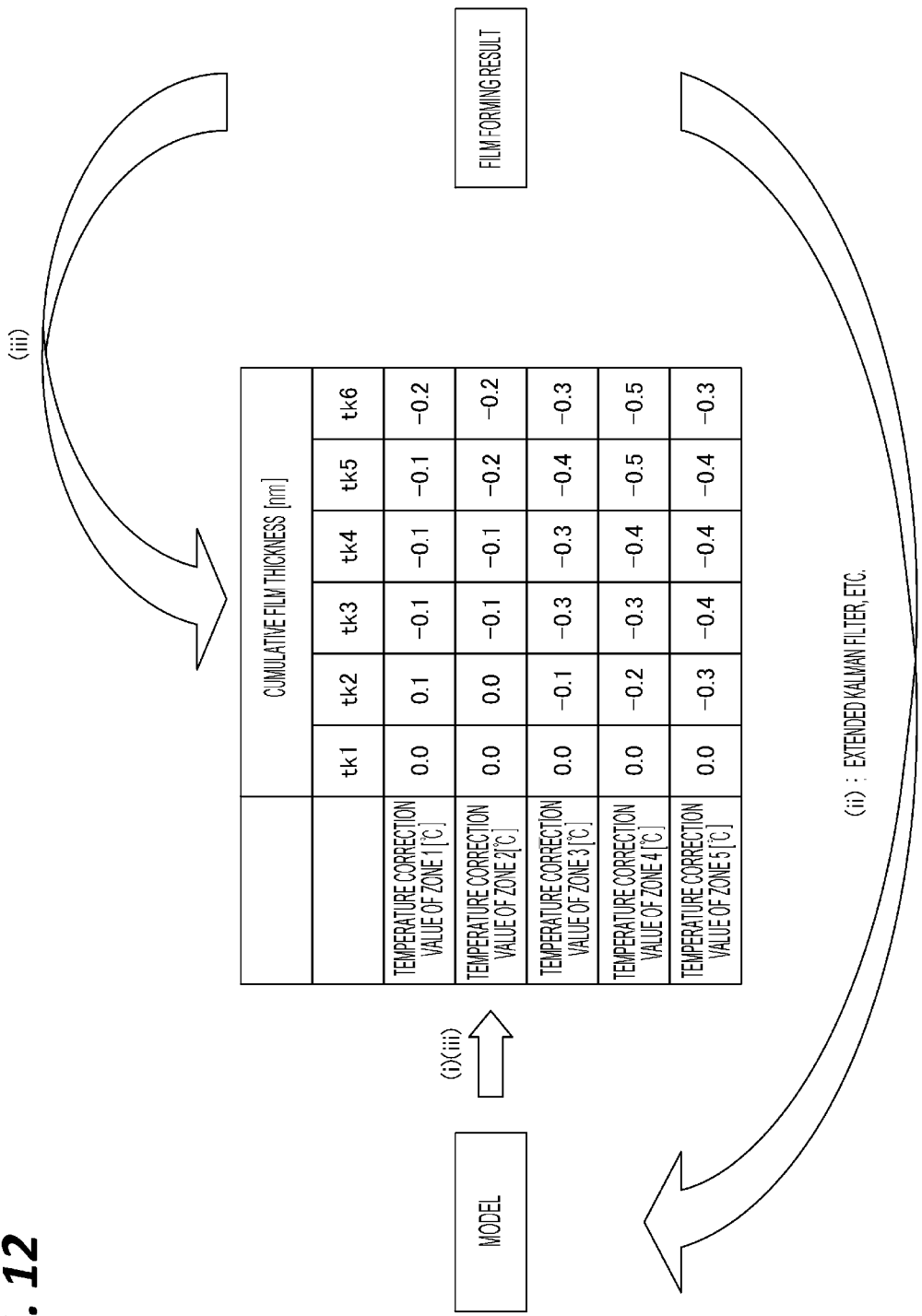
FIG. 12 is an example of a diagram for explaining a relationship between the model and the temperature correction table.

FIG. 12 is a diagram for explaining a relationship between the model and the temperature correction table.

(i) In a state where the initial model is prepared in advance, the temperature correction information generation unit 62 generates the temperature correction table using the model and the film forming result of the initial heat treatment.

(ii) Further, the model learning unit 63 updates the model itself using the film forming result in the second and subsequent calculations (processing of updating the model based on the film forming result obtained in a state where the set temperature is corrected with the temperature correction table).

(iii) When the temperature correction table is generated, the temperature correction information generation unit 62 may update the temperature correction table using the model and the film forming result.

In this way, since the model and the temperature correction table are updated with the film forming result, a film thickness close to the target film thickness may be obtained even if the cumulative film thickness increases.

[Problems Due to Update of Model and Temperature Correction Table]

The learning function of the model and the temperature correction table may be arbitrarily switched on or off by the user of the semiconductor manufacturing apparatus 2. However, in the following case, the calculated model and temperature correction table may not be appropriate, and it is difficult for the user to determine whether to switch the learning function on or off.

Figure 13:
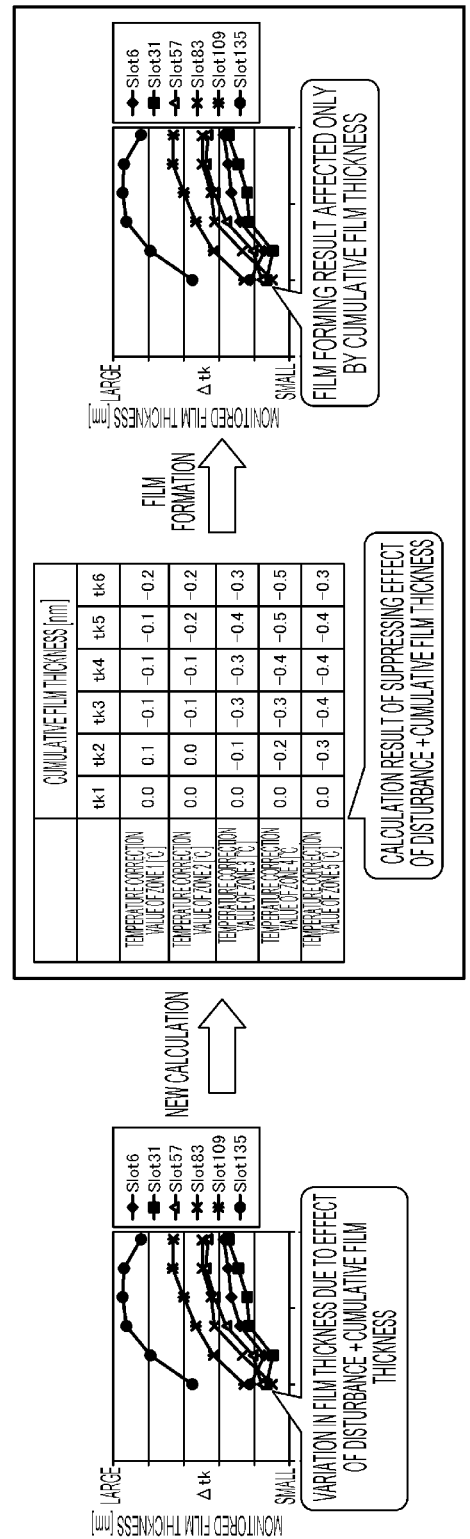
FIG. 13 is an example of a diagram for explaining a case where the calculated model and the temperature correction table are not appropriate.

FIG. 13 is a diagram for explaining a case where the calculated model and temperature correction table are not appropriate. First, as a premise, since the temperature correction value of the temperature correction table is small (less than about 0.5° C.), the learning function may not be performed correctly if there is disturbance (film thickness variation factor) other than the cumulative film thickness. That is, there may occur a situation in which the temperature correction value due to disturbance is larger than the temperature correction value depending on the cumulative film thickness.

Part (a) of FIG. 13 illustrates the film forming result when the heat treatment is performed under the effect of both disturbance and the cumulative film thickness. The temperature correction information generation unit 62 has generated the temperature correction table using the model based on the film forming result. In this case, the obtained temperature correction table contains not only the cumulative film thickness but also the temperature correction value for suppressing the effect of disturbance (part (b) of FIG. 13). The temperature correction information generation unit 62 transfers the generated temperature correction table to the control unit 50, and the control unit 50 calculates (corrects) the set temperature by the generated temperature correction table.

Next, it is assumed that the semiconductor manufacturing apparatus 2 has performed the heat treatment based on the set temperature corrected by the temperature correction table, but the disturbance has disappeared at this time point. In this case, the semiconductor manufacturing apparatus 2 needs to form a film with the temperature correction value resulting only from the cumulative film thickness, but since the temperature correction table also includes the temperature correction value for suppressing the effect of disturbance, a desired film forming result is not obtained (part (c) of FIG. 13).

The model learning unit 63 learns the model based on the film forming result of part (c) of FIG. 13, but recognizes the deviation of the film forming result due to the absence of disturbance as the deviation of the model, thus performing erroneous learning. That is, it is undesirable for the model learning unit 63 to learn the model based on the film forming result of part (c) of FIG. 13. If the model learning unit 63 learns the model based on the film forming result of part (c) of FIG. 13, there is a risk of the temperature correction table being also not appropriate.

To suppress this problem, the temperature correction information calculation device 4 may switch off the learning function of the model in principle. Switching off the learning function of the model means that the temperature correction table is newly generated based on the film forming result by the initial heat treatment in a state where the model remains in the initial state. When the learning is OFF, the model is not updated, but the temperature correction table is newly generated.

However, the film forming result may not be improved in the temperature correction table using a low accuracy model.

Figure 14:
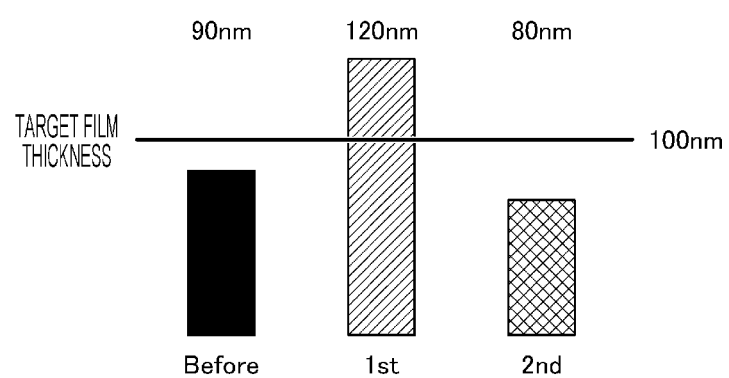
FIG. 14 is an example of a diagram for explaining the film forming result which is not improved.

FIG. 14 is a diagram illustrating an example of the film forming result that is not improved. For convenience of explanation, the target film thickness is set to 100 nm. In the absence of the temperature correction table (initial heat treatment), the film thickness was smaller than the target film thickness (90 nm). When the temperature correction information calculation device 4 generated the temperature correction table using this film forming result (first calculation) to form a film, the film was thicker than the target film thickness (120 nm). Next, when the semiconductor manufacturing apparatus 2 formed a film using the temperature correction table generated with the same model, the film was thinner than the target film thickness (80 nm).

As illustrated in FIG. 14, if the low accuracy model is not updated, the film forming result such as an excessively thick film or excessively thin film with respect to the target film thickness may be obtained every heat treatment, and there is a risk of stable film formation being difficult even if the temperature correction table generated with the low accuracy model is used.

[Automatic Switching of Learning Function]

Hence, the temperature correction information calculation apparatus 4 of the present embodiment controls ON or OFF of the learning function of the model as follows.

The default setting of the learning function is switched off (new calculation of the temperature correction table).

In the second and subsequent calculations, the temperature correction information calculation device 4 automatically determines ON or OFF of the learning function.

FIG. 15 is a diagram for explaining an example of a method of determining whether the learning function is ON or OFF. The learning determination unit 64 determines whether or not to update the model using the following two criteria (I and II).

I. It May be Inferred that there is Disturbance→OFF

An example of determining whether or not there is disturbance is a method of inferring that from the film forming result. For example, when the in-plane distribution of the film thickness varies significantly, there is a possibility of disturbance being included in the film forming processing. Part (a) of FIG. 15 illustrates an example in which the film thickness increases at the center of the semiconductor wafer W.

Further, there is an inferring method using other factors. For example, when hardware such as a temperature sensor including a thermocouple was replaced before the heat treatment, there is a possibility that the individual difference in the temperature sensor affects the measured temperature.

II. It May be Inferred that there is No Disturbance, and the Accuracy of the Model is Low→ON It may be inferred that there is no hope of improvement without learning the model when the semiconductor manufacturing apparatus 2 has performed the film forming processing by temperature correction using the temperature correction table but the monitored film thickness deviates from the target film thickness.

In the example of part (b) of FIG. 15, as in FIG. 14, the semiconductor manufacturing apparatus 2 has performed a heat treatment by temperature correction using the temperature correction table, but the film forming result such as an excessively thick film or excessively thin film is obtained every heat treatment (cycle) time with respect to the target film thickness. In this case, it may be inferred that there is no hope of improvement (the precision of the model is low) without learning the model.

[Switching ON or OFF of Learning Function of Model]

Figure 16:
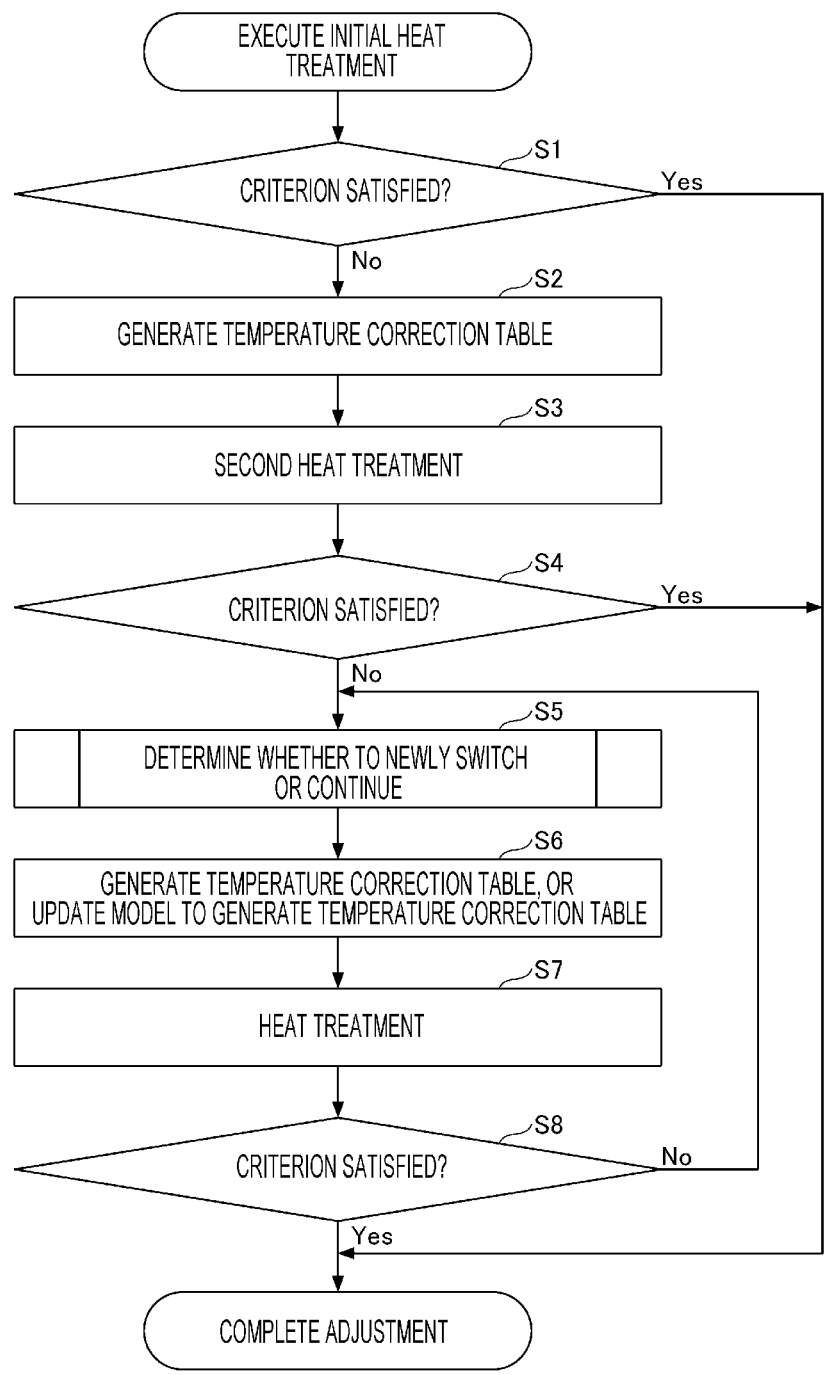
FIG. 16 is an example of a flowchart illustrating a sequence in which a learning determination unit switches on or off the learning function of the model.

FIG. 16 is a flowchart illustrating a sequence in which the learning determination unit 64 switches on or off the learning function of a model. The processing of FIG. 16 is executed subsequent to the initial heat treatment.

When the initial heat treatment (first cycle) ends, the measurement device 60 measures the monitored film thickness of the semiconductor wafer W as a monitoring target. The learning determination unit 64 determines whether or not the monitored film thickness satisfies the criterion with respect to the target film thickness (S1). The criterion means that the difference between the monitored film thickness and the target film thickness is within a threshold value for each cumulative film thickness. When the criterion is satisfied, the temperature correction table is unnecessary, so that the processing of FIG. 16 ends.

If the criterion is not satisfied, the temperature correction information generation unit 62 generates the temperature correction table from the model in the initial state and the film forming result (S2). As such, if the film forming result does not meet the criterion, the temperature correction table is automatically generated. Since the learning function of the model is off, the model is not updated.

The semiconductor manufacturing apparatus 2 performs the heat treatment of the second cycle using the temperature correction table (S3).

When the heat treatment of the second cycle ends, the measurement device 60 measures the monitored film thickness of the semiconductor wafer W as a monitoring target. The learning determination unit 64 determines whether or not the monitored film thickness satisfies the criterion with respect to the target film thickness (S4). Steps S2 to S4 correspond to the first calculation.

If the criterion is satisfied, it is determined that the temperature correction table generated in step S2 is appropriate, so that the processing of FIG. 16 ends.

If the criterion is not satisfied, the learning determination unit 64 determines whether to switch on the learning function of the model or leave it off (S5). The details of step S5 will be described with reference to FIG. 17.

When the learning function of the model is OFF, the temperature correction information generation unit 62 generates a new temperature correction table based on the current model (e.g., the model in the initial state) and the film forming result in step S3 or S7. When the learning function of the model is ON, the model learning unit 63 learns (updates) the model, and the temperature correction information generation unit 62 updates the temperature correction table using the model after learning and the film forming result in step S3 or S7 (S6).

Thereafter, similarly, the semiconductor manufacturing apparatus 2 repeatedly executes the heat treatment to determine whether or not the criterion is satisfied (S7 and S8). If the criterion is not satisfied, the heat treatment is executed from step S5, so that the learning determination unit 64 may determine whether or not to switch on the learning function of the model.

Figure 17:
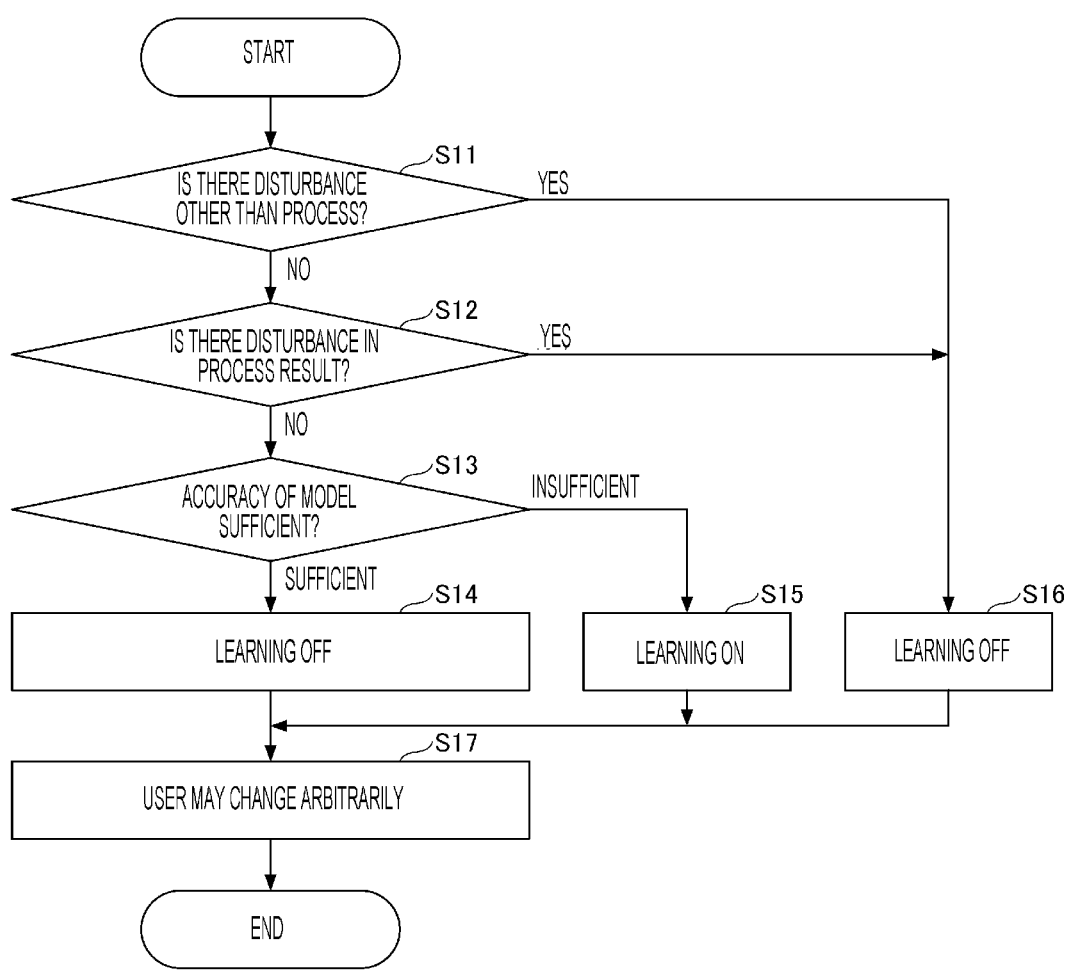
FIG. 17 is an example of a flowchart for explaining a method of determining whether the learning function of the model is switched on or off by the learning determination unit.

FIG. 17 is a flowchart for explaining a method of determining whether the learning function of the model is switched on or off by the learning determination unit 64. Further, FIGS. 18A to 18C are a diagram enumerating a specific content of the determination of ON or OFF of the learning function of the model.

The learning determination unit 64 determines whether or not there is disturbance other than the process (S11). As illustrated in FIG. 18A, the disturbance other than the process means that "an (artificial) operation that naturally affects the process result without the need to confirm the process result is performed." The disturbance inferred from the process result means "a state where there is no particular abnormality in the external condition such as the process recipe or the hardware condition of the apparatus, but it is expected that some (unintentional) disturbance is included in the actual film forming result." For example, the following may be mentioned.

a) Hardware such as the temperature sensor was replaced before the heat treatment.

The log information includes hardware information such as temperature sensor identification information, and the learning determination unit 64 may detect hardware replacement by a change in this hardware identification information. There is a risk of the individual difference in hardware affecting temperature control and that the film forming result being not suitable for the update of the model.

b) The user edited the process recipe with respect to the set temperature to perform the heat treatment.

More precisely, a case where the user edits even one parameter related to film formation such as the gas flow rate or the film forming time as well as the temperature to perform the heat treatment is the disturbance other than the process. That is, in the flow of heat treatment A→temperature correction table calculation (computing)/update→process recipe parameter editing→heat treatment B→model update→temperature correction table calculation (computing), if learning is performed in a state where the original film forming condition differs between heat treatment A and heat treatment B (the film forming condition of the process recipe is changed before heat treatment B), the wrong model is learned as if the film thickness is deviated due to the deviation of the model despite that originally, the film thickness is deviated due to the difference in the film forming condition.

Since the log information includes the set temperature, if the user who determined that the recipe has been edited edits the process recipe when the data of the past calculation history and the log information do not match, there is a risk that the film forming result being not suitable for the update of the model since it includes the effect of the temperature set by the user.

c) The monitored position has been changed.

The user may set the position of the semiconductor wafer W where the film thickness is monitored (which semiconductor wafer W of the wafer boat 18 is monitored about the film thickness by the measurement device). The slot number of the wafer boat 18 whose film thickness has been monitored is recorded in the log information. If the monitored position is changed, there is a risk that the film forming result being not suitable for the update of the model since it includes the difference in the monitored position.

d) More than a certain amount of time such as half a year has passed from the last update of the model to the implementation of this heat treatment.

The execution date and time of the heat treatment is recorded in the log information. If the time from the update of the model to the implementation of the heat treatment is long, there is a risk of the film forming result being not suitable for the update of the model since the state of the semiconductor manufacturing apparatus 2 may change.

e) The surface state (with or without coating) of the dummy wafer does not match.

It can be seen that the history of each semiconductor wafer W is managed by a management device (not illustrated) and the initial state of the semiconductor wafer W is different. If the surface state of the semiconductor wafer when the model is generated and the surface state of the semiconductor wafer in this film forming process are different, the film forming result is also changed, and therefore, there is a risk of the film forming result being not suitable for the update of the model.

f) The magnification (output) of a top plate heater or cooling fan is extremely high.

The magnification of the top plate heater or cooling fan is also included in the log information. Since it is known that an extreme change in the output of the heater or cooling fan affects the film forming result, there is a risk of the film forming result being not suitable for the update of the model.

Since the model should not be learned when there is disturbance other than the process, the learning determination unit 64 determines that the learning function of the model is switched off (S16). That is, the temperature correction information generation unit 62 newly generates the temperature correction table. The generated temperature correction table is deleted, or treated so as not to be used.

When there is no disturbance other than the process, the learning determination unit 64 determines whether or not there is disturbance in the film forming result (process result) (S12). As illustrated in FIG. 18B, the disturbance of the film forming result means the following.

g) There is an extreme change in the in-plane distribution of the film thickness of the semiconductor wafer W or in the uniformity between the semiconductor wafers.

The in-plane distribution of the film thickness of the semiconductor wafer W or the film thickness of the semiconductor wafer W as a monitoring target is measured by the measurement device 60. In this case, since factors other than the temperature may affect, there is a risk of the film forming result being not suitable for the update of the model.

h) There is measurement noise (abnormal point) upon the measurement of the film thickness.

The measurement noise (abnormal point) means that the film thickness that cannot or hardly occurs in film formation is measured. In this case, since it may be determined that the reliability of the monitored film thickness is not sufficient, there is a risk of the film forming result being not suitable for the update of the model.

Since the model should not be learned when there is disturbance in the film forming result, the learning determination unit 64 determines that the learning function of the model is switched off (S16). That is, the temperature correction information generation unit 62 newly generates the temperature correction table. The generated temperature correction table is deleted, or treated so as not to be used.

When there is no disturbance in the film forming result, the learning determination unit 64 determines whether or not the accuracy of the model is sufficient (S13). As illustrated in FIG. 18C, the insufficient accuracy of the model refers to the following cases.

i) The film forming result deteriorated before and after the calculation of the temperature correction table.

For example, in the processing of FIG. 16, when the film forming result of the heat treatment (S3) after optimizing the temperature correction table by calculation is worse than the film forming result of the initial heat treatment, the learning is switched off at the timing of the determination of S5. When the accuracy of the model is low regardless of the presence or absence of learning, the film forming result may not approach the target film thickness even if the temperature correction table optimized by calculation is used. In that case, it is necessary to update (learn) the model.

Such a phenomenon may occur when there is a gap between the condition (e.g., temperature or pressure) at the time of model generation and the condition at the time of actual heat treatment, or when data at the time of model generation is insufficient.

Since the model needs to be updated when the accuracy of the model is not sufficient, the learning determination unit 64 switches on the learning function of the model (S15). In this case, the temperature correction table is updated with the model after learning.

Since there is no need to update the model when the accuracy of the model is sufficient, the learning determination unit 64 switches off the learning function of the model (S14). That is, the temperature correction information generation unit 62 newly generates the temperature correction table. The generated temperature compensation table is deleted, or treated so as not to be used.

Further, as in the related art, the user may set the learning function of the model to ON or OFF regardless of the determined result of the learning of the model by the learning determination unit 64 (S17).

[Effects Expected by Automatic Switching of ON and OFF of Learning Function of Model]

Figure 19:
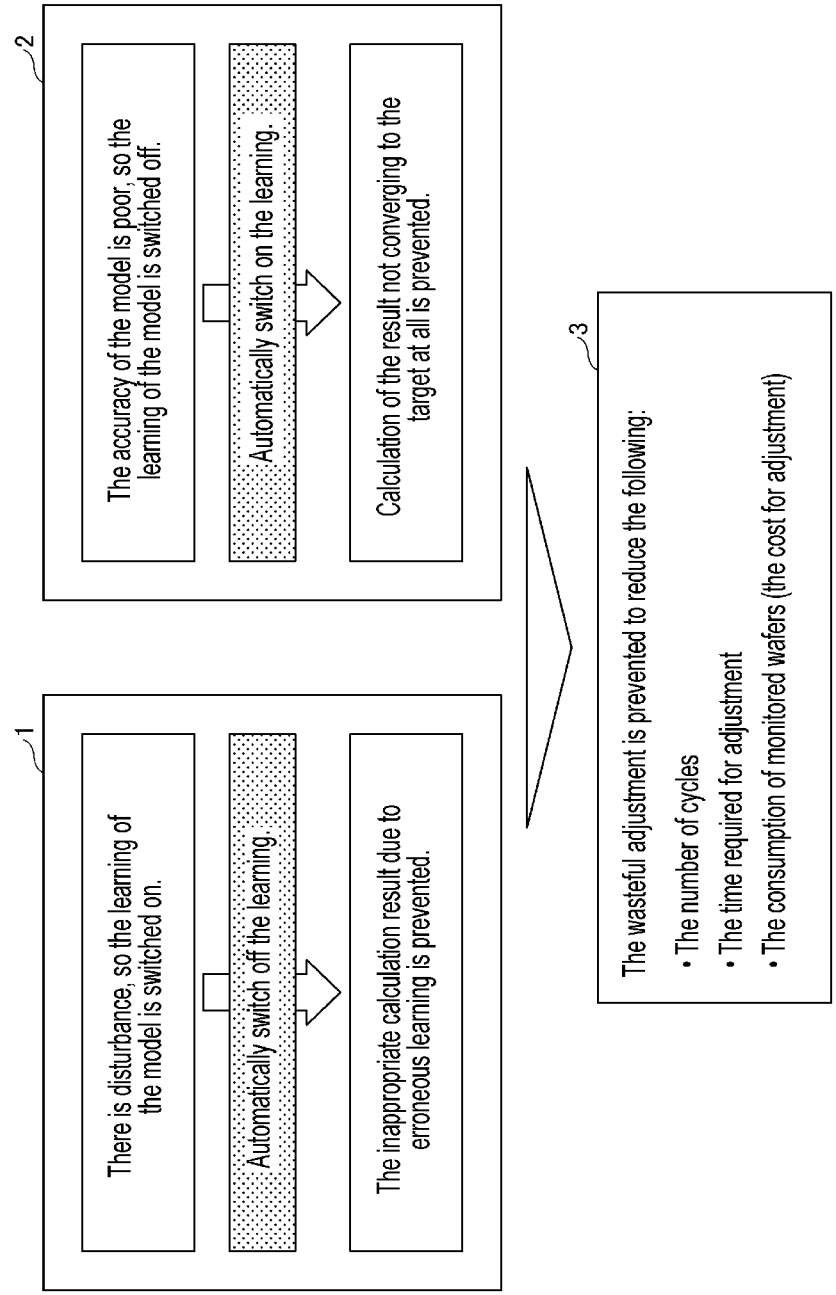
FIG. 19 is an example of a diagram for explaining the effects expected by automatically switching on or off the learning function of the model.

FIG. 19 is a diagram for explaining the effects expected by automatically switching on or off the learning function of the model.

1. First, if there is disturbance but the learning of the model is switched on, the learning determination unit 64 may automatically control the learning to be switched off. Thus, the temperature correction information calculation device 4 may prevent calculation of an inappropriate temperature correction table due to erroneous learning.

2. Further, if the accuracy of the model is poor but the learning of the model is switched off, the learning determination unit 64 may automatically control the learning to be switched on. Thus, the temperature correction information calculation device 4 may prevent a temperature correction table from being calculated with a model which brings the film forming result not converging to the target film thickness.

3. And by these effects, the temperature correction information calculation device 4 may reduce the number of times of the wasteful heat treatment such as the second and subsequent heat treatments. As a result, the present disclosure may reduce the number of cycles of the heat treatment to be executed, the time required for adjustment, and the consumption of monitored wafers. That is, the present disclosure may reduce the cost for adjusting the temperature in the heat treatment.

[Main Effects]

As described above, since the heat treatment system of the present embodiment may automatically switch on and off the learning function of the model, the need for the user to make a complicated determination may be reduced. Further, since the learning function of the model is automatically switched on or off, the set temperature of the heat treatment for the semiconductor wafer may be easily adjusted.

[Others]

In the present embodiment, the temperature correction information calculation device 4 illustrated in FIG. 1 performs the learning of the model or the generation of the temperature correction table, but the semiconductor manufacturing apparatus 2 may have the function of the temperature correction information calculation device 4.

Further, the temperature correction information calculation device 4 may be a server connected to a network. The semiconductor manufacturing apparatus 2 may communicate with the temperature correction information calculation device 4 to acquire the temperature correction table. The temperature correction information calculation device 4 may exist on-premises or in the cloud.

Further, the heat treatment system 1 of FIG. 1 is an example, and it goes without saying that there are various system configuration examples depending on the application or purpose. The classification of devices such as the host computer 3, the semiconductor manufacturing apparatus 2, the measurement device 60, and the temperature correction information calculation device 4 in FIG. 1 is an example.

For example, the heat treatment system 1 may be configured in various ways such as a configuration in which at least two of the host computer 3, the semiconductor manufacturing apparatus 2, the measurement device 60, and the temperature correction information calculation device 4 are integrated, or a further divided configuration. For example, the temperature correction information calculation device 4 may be prepared for each semiconductor manufacturing apparatus 2.

The semiconductor manufacturing apparatus 2 disclosed in this specification is not limited to a batch processing apparatus, but may be applied to either a single-wafer apparatus that processes substrates one by one or a semi-batch apparatus.

A substrate processing performed by the semiconductor manufacturing apparatus disclosed in this specification may be applied not only to a film forming processing, but also to an oxidation device that performs an oxidation processing of oxidizing a surface region of a semiconductor wafer, a diffusion device that performs a processing of diffusing (doping) impurities into a surface region of a semiconductor wafer, an annealing device, and an etching device.

The semiconductor manufacturing apparatus 2 disclosed in this specification may be an apparatus for processing a substrate using a plasma.

It is possible to provide a technique capable of easily adjusting the set temperature of a heat treatment for a processing target object.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A temperature correction information calculation device of a semiconductor manufacturing apparatus, the temperature correction information calculation device comprising:
   a model storage circuitry configured to store a model for generating temperature correction information in which a temperature correction value is associated with a cumulative film thickness that is accumulated on an inner wall of the semiconductor manufacturing apparatus that forms a film on a processing target object by a heat treatment at a set temperature corrected according to the cumulative film thickness;
   a learning determination circuitry configured to determine whether or not to update the model based on whether there is an external disturbance in a film forming result obtained by the heat treatment;
   a model learning circuitry configured to update the model based on the film forming result on the processing target object when the learning determination circuitry determines to update the model; and
   a temperature correction information generation circuitry configured to generate the temperature correction information using the model updated by the model learning circuitry and correct the set temperature by the temperature correction information.

2. The temperature correction information calculation device according to claim 1, wherein the learning determination circuitry determines not to update the model when determined that the film forming result is affected by the external disturbance.

3. The temperature correction information calculation device according to claim 2, wherein the learning determination circuitry determines not to update the model when hardware included in the semiconductor manufacturing apparatus has been replaced before the film forming result is obtained.

4. The temperature correction information calculation device according to claim 2, wherein the learning determination circuitry determines not to update the model when a parameter related to film formation has been edited.

5. The temperature correction information calculation device according to claim 2, wherein the learning determination circuitry determines not to update the model when a position of the processing target object on which film thickness is monitored has been changed before the film forming result is obtained.

6. The temperature correction information calculation device according to claim 2, wherein the learning determination circuitry determines not to update the model when a predetermined amount of time has been elapsed from a last update of the model to a current heat treatment.

7. The temperature correction information calculation device according to claim 2, wherein the learning determination circuitry determines not to update the model when determined based on a history of the processing target object managed by a management device that a surface state of the processing target object is different from that at the last update of the model.

8. The temperature correction information calculation device according to claim 2, wherein the learning determination circuitry determines not to update the model when an output of a heater or cooling fan is equal to or greater than a certain level in a heat treatment having the film forming result obtained.

9. The temperature correction information calculation device according to claim 2, wherein the learning determination circuitry determines not to update the model when an in-plane distribution of the film thickness of the processing target object or a difference in film thickness between processing target objects does not satisfy a criterion.

10. The temperature correction information calculation device according to claim 2, wherein the learning determination circuitry determines to update the model when the film forming result of the heat treatment after the update of the model deviates from a target film thickness compared to the film forming result before the update.

11. A semiconductor manufacturing apparatus comprising the temperature correction information calculation device according to claim 1.

12. A temperature correction information calculation method of a semiconductor manufacturing apparatus, the method comprising:

obtaining a film forming result from a heat treatment performed on a processing target object at a set temperature corrected according to a cumulative film thickness that is accumulated on an inner wall of the semiconductor manufacturing apparatus;

determining whether or not to update a model for generating temperature correction information in which a temperature correction value is associated with the cumulative film thickness based on whether there is an external disturbance in the film forming result obtained by the heat treatment at the obtaining;

updating the model based on the film forming result on the processing target object when determined to update the model at the determining; and generating the temperature correction information using the model updated at the updating.

13. A non-transitory computer-readable storage medium having stored therein a program that causes a temperature correction information calculation device of a semiconductor manufacturing apparatus to function as:

a model storage circuitry configured to store a model for generating temperature correction information in which a temperature correction value is associated with a cumulative film thickness that is accumulated on an inner wall of the semiconductor manufacturing apparatus that forms a film on a processing target object by a heat treatment at a set temperature corrected according to the cumulative film thickness;

a learning determination circuitry configured to determine whether or not to update the model based on whether there is an external disturbance in a film forming result obtained by the heat treatment;

a model learning circuitry configured to update the model based on the film forming result on the processing target object when the learning determination circuitry determines to update the model; and a temperature correction information generation circuitry configured to generate the temperature correction information using the model updated by the model learning circuitry and correct the set temperature by the temperature correction information.

* * * * *